(12) United States Patent
Sato et al.

(10) Patent No.: US 6,707,535 B2
(45) Date of Patent: Mar. 16, 2004

(54) DEVICE FOR EXPOSURE OF A PERIPHERAL AREA

(75) Inventors: Masanori Sato, Yokohama (JP); Yutaka Shindo, Machida (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 49 days.

(21) Appl. No.: 10/151,182

(22) Filed: May 21, 2002

(65) Prior Publication Data

US 2003/0117597 A1 Jun. 26, 2003

(30) Foreign Application Priority Data

May 21, 2001 (JP) .......................... 2001-151037

(51) Int. Cl.⁷ .......................... G03B 27/42; G03B 27/54
(52) U.S. Cl. .......................................... 355/53; 355/67
(58) Field of Search ............................. 355/53, 40, 67, 355/68; 356/400, 615; 430/30

(56) References Cited

U.S. PATENT DOCUMENTS

| | | | | |
|---|---|---|---|---|
| 4,899,195 A | | 2/1990 | Gotoh | |
| 5,168,021 A | * | 12/1992 | Arai et al. | 430/22 |
| 5,204,224 A | * | 4/1993 | Suzuki | 430/315 |
| 5,229,811 A | * | 7/1993 | Hattori et al. | 355/50 |
| 5,289,263 A | * | 2/1994 | Kiyokawa et al. | 356/615 |
| 5,361,121 A | * | 11/1994 | Hattori et al. | 355/50 |
| 5,420,663 A | * | 5/1995 | Nakajima et al. | 355/50 |
| 5,811,211 A | * | 9/1998 | Tanaka et al. | 430/30 |
| 5,880,816 A | * | 3/1999 | Mimura et al. | 355/53 |
| 5,929,976 A | * | 7/1999 | Shibuya et al. | 355/53 |
| 5,982,474 A | * | 11/1999 | Akiyama et al. | 355/53 |
| 6,052,173 A | * | 4/2000 | Miura et al. | 355/53 |

* cited by examiner

*Primary Examiner*—Rodney Fuller
(74) *Attorney, Agent, or Firm*—Nixon Peabody LLP; David S. Safran (57) ABSTRACT

A device for exposing a peripheral area of a wafer having a photoresist applied thereon is provided in which an irradiation area is prevented from moving in a V-shape in a notch area of the wafer and unnecessary exposure of the wafer is prevented. The device includes an edge determination device, a device for moving the edge determination device, a irradiation moving device and a controller to control the edge determination moving device such that the amount of light received by the light receiving part becomes constant. The controller stops operation of the irradiation moving device when receiving a signal from the edge determination device showing the start of the notch and restarts operation after a given time has passed, or upon receiving a signal indicating the end of the notch.

2 Claims, 10 Drawing Sheets

DEVICE FOR EXPOSURE OF A PERIPHERAL AREA

BACKGROUND OF THE INVENTION

1. Field of the Invention

The invention relates to a device for exposing a peripheral area which exposes the peripheral area of a wafer in order to remove a photoresist which has been applied to the surface of a semiconductor wafer in the peripheral area of the wafer, wherein the outside peripheral area of the semiconductor wafer is provided with a V-shaped notch.

2. Description of the Related Art

Figure 8:
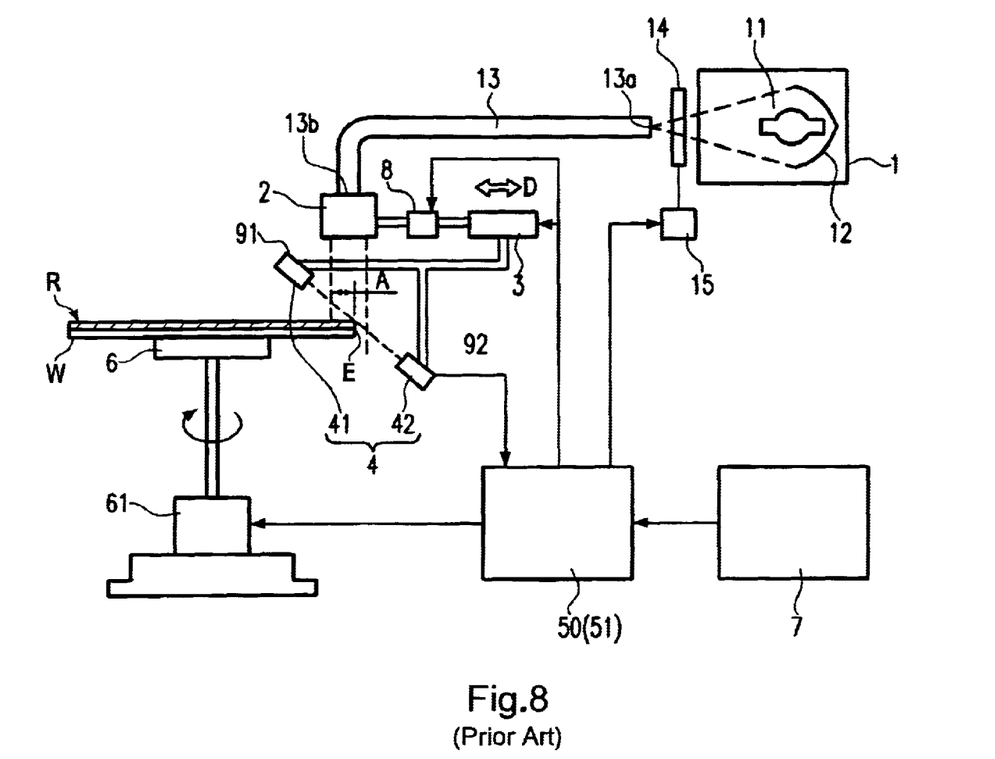
FIG. 8 shows a schematic of the arrangement of a conventional device for exposing a peripheral area.
Figure 9:
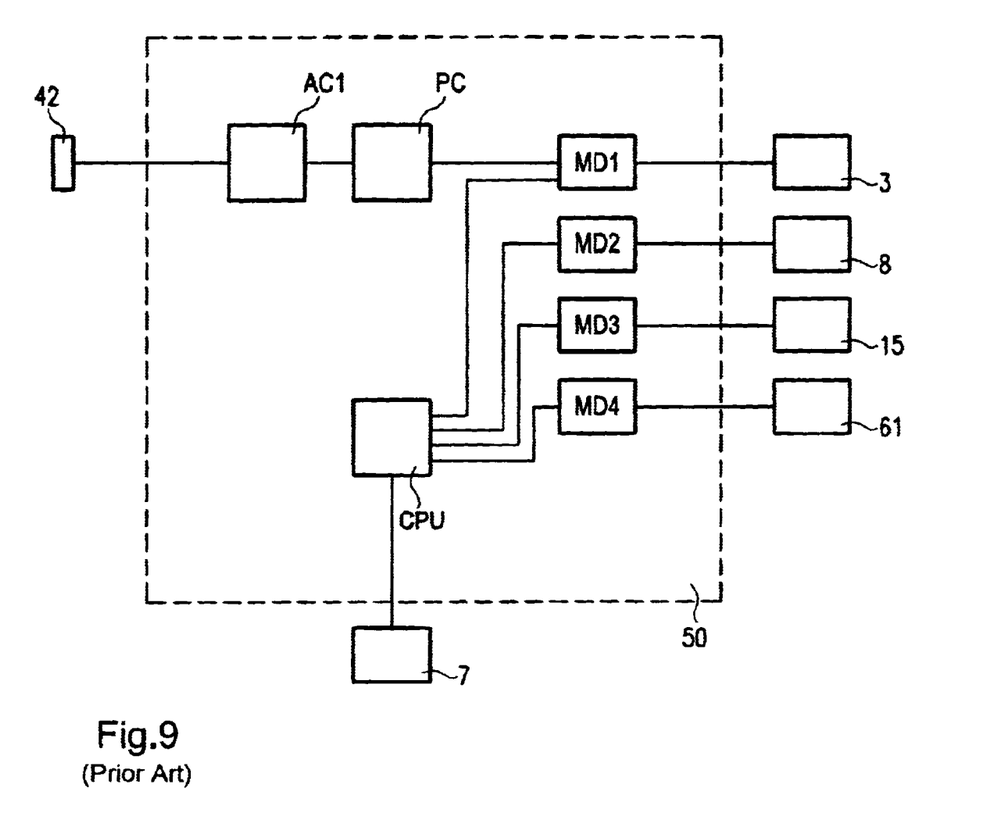
FIG. 9 shows a schematic of the arrangement of a conventional controller for exposing a peripheral area.
Figure 10A:
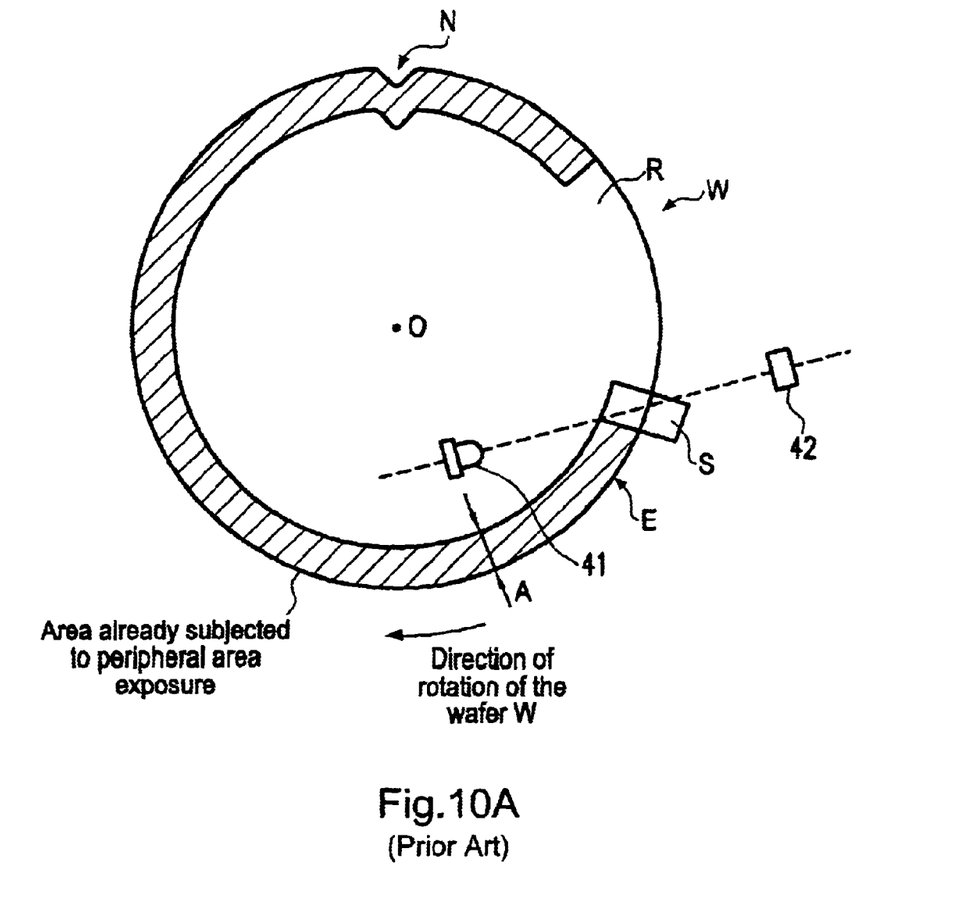
FIG. 10A shows a schematic of the state in which the peripheral area of the wafer is exposed by a conventional device for exposing a peripheral area.
Figure 10B:
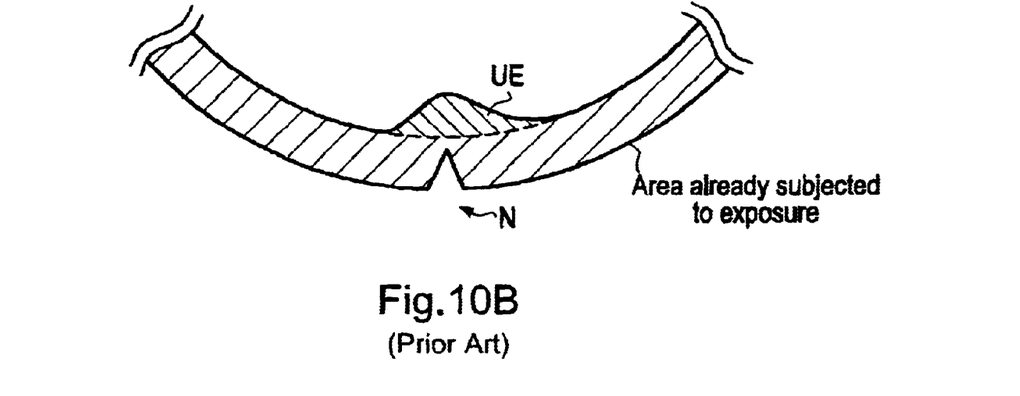
FIG. 10B shows a schematic of the state in which the notch area is exposed by a conventional device for exposing a peripheral area.

A conventional device for exposure of a peripheral area is described below using FIG. 8, FIG. 9, FIG. 10A and FIG. 10B. FIG. 8 illustrates a schematic of the arrangement of a conventional device for exposure of a peripheral area. FIG. 9 shows a schematic of the arrangement of a controller of a conventional device for exposure of a peripheral area. FIG. 10A shows a state in which the peripheral area of a wafer is exposed by a conventional device for exposure of a peripheral area. FIG. 10B shows the exposure state of a notch area by a conventional device for exposure of a peripheral area.

In a light source device, there is a lamp 11 which emits light containing UV radiation, for example, a super-high pressure mercury lamp with a nominal wattage of 250 W. The radiant light from this lamp 11 is focused with a focusing mirror 12 on the incidence end face 13a of optical fibers 13. Between the lamp 11 and the incidence end face 13a of the optical fibers 13, there is a shutter 14 which is opened or closed by the drive of a shutter drive device 15.

When a shutter OPEN signal is sent from the operating part of the CPU within the controller 50 to the part MD3 for driving the shutter drive device, the part MD3 drives the shutter drive device 15, the shutter 14 opens and the light focused by the focusing mirror 12 is incident on the incidence end face 13a of the optical fibers 13 and is emitted as exposure light with a stipulated irradiation area S from an exposure light irradiation part 2 which is installed on the exit end face 13b of these optical fibers 13.

The exposure light irradiation part 2 is located integrally with a means 4 for edge determination (detailed below) and is movably held by a device 3 for moving the means for edge determination in the direction which is essentially perpendicular to a tangent to the edge E of the wafer W, i.e. essentially in the direction to the wafer center O (in the two directions D of the arrow in FIG. 8). The exposure light emitted from the exposure light irradiation part 2 with the stipulated exposure area S moves therefore in the same direction and by the same amount as the means 4 for edge determination.

The wafer W with an outside peripheral area which is provided with a notch N and to which a photoresist R has been applied is placed on a treatment stage 6. The wafer W is attached by an attachment means which is not shown in the drawings, for example by vacuum suction. The treatment stage 6 is rotationally held by a treatment stage rotation device 61.

When a stage rotary start signal is sent from the operating part of the CPU within the controller 50 to the part MD4 for driving the treatment stage rotation device, the part MD4 drives the treatment stage rotation device 61 and, based on the data which was input into the input part 7, such as the speed of rotation, the angle of rotation, the frequency of rotation and the like, starts rotation of the treatment stage 6.

The sequence of exposure of the peripheral area of the wafer in a conventional device for exposing a peripheral area is described as follows. First, the wafer W with an outside peripheral area provided with a notch N and to which a photoresist R has been applied is transported by a wafer transport and placement means (not shown in the drawings) and placed on the treatment stage 6 in a state in which the middle O of the wafer W and the center of rotation of the treatment stage 6 essentially agree with one another.

Next, if an exposure width adjustment start signal is sent from the operating part of the CPU within the controller 50 to the part MD2 for driving the exposure width adjustment device, the part MD2, based on data of the exposure width A (the width to be exposed proceeding from the edge E of the wafer W) which were input beforehand into the input part 7, drives the exposure width adjustment device 8 and moves the area S irradiated with the exposure light to a given position (position at which the area with the width A proceeding from the edge E of the wafer W can be exposed when the means 4 for edge determination described below captures (determines) the edge E of the wafer W).

Next, if a wafer edge determination start signal is sent from the operating part of the CPU within the controller 50 to the part MD1 for driving the device for moving the means for edge determination, the part MD1 drives the device 3 for moving the means for edge determination and moves the means 4 for edge determination in the direction to the wafer W. The determination of the position of the edge E of the wafer W is started by the means 4 for edge determination.

The controller 50 then drives the shutter drive device 15 when it receives a signal from a light receiving part 42 of the means 4 which shows that the edge E of the wafer W is determined. This causes the shutter 14 to open which irradiates the peripheral area of the wafer W via the exposure light irradiation part 2 with exposure light with the given irradiation area S. The controller 50 furthermore drives the treatment stage rotation device 61 almost simultaneously with opening of the shutter 14, and exposes the peripheral area of the wafer W by turning the wafer W with a rotational speed (which is input beforehand into the input part 7) and in an angular range (also input beforehand into the input part 7). The controller 50 controls the device 3 for moving the means for edge determination and moves the means 4 for edge determination to a position at which the means 4 for edge determination outputs a signal to the controller 50 which shows that the edge E of the wafer W is always captured. As was described above, the area S irradiated with exposure light before exposure is moved to a position at which the area with a width A proceeding from the edge E of the wafer W can be exposed when the means 4 captures the edge E of the wafer W. Moreover, upon exposure, irradiation area S is synchronized with the means 4 and moved in the same direction and by the same amount. The peripheral area of the wafer W can therefore be exposed at the exposure width A which is constant proceeding from the edge E of the wafer W.

When exposure of the peripheral area of the wafer W is completed, the controller 50 closes the shutter 14, ends rotation of the treatment stage 6 and furthermore returns the exposure light irradiation part 2 to the initial position.

A process for determining the wafer edge is now described. The means 4 for determining the edge E of the wafer W consists of the projection part 41 which projects sensor light and the light receiving part 42 which receives this sensor light and outputs to the controller 50 an analog signal which becomes larger or smaller depending on the amount of sensor light projected by the projection part 41 onto the light receiving part 42. The controller 50 amplifies the above described analog signal from the light receiving part 42 by means of an amplifier AC1. For example, in the case of complete shielding by the wafer W which has been placed on the treatment stage 6, a signal which is obtained is amplified to −5 V and, in the case of no shielding at all, a signal which is obtained is amplified to +5 V.

The above described voltage signal which was amplified in the above described amplifier AC1 is computed in a PID circuit PC and a control signal which is used to make the above described voltage signal into a constant voltage is output to the part MD1 for driving the device for moving the means for edge determination.

The part MD1 for driving the device for moving the means for edge determination within the controller 50, drives the device 3 for moving the means for edge determination such that the means 4 for edge determination is positioned at a site at which the signal from the light receiving part 42 is, for example, 0 V, i.e. at which the sensor light from the projection part 41 is half-shielded and at which the other half is received by the light receiving part 42. The means 4 for edge determination therefore always moves to the above described position, i.e. to the position of the edge E of the wafer W.

As was described above, in a conventional device for exposing the peripheral area, the peripheral area of the wafer W is exposed by the edge E of the wafer always being captured. In the outside peripheral area, therefore, a V-shaped notch N is formed. When the wafer W, to which the photoresist R has been applied, is exposed, therefore the means 4 for edge determination in the area of the notch N also moves in a V-shape since it tries to capture the edge E of the wafer W. Since the area S which has been irradiated with exposure light and which moves synchronized with the means 4 for edge determination, in the area of the notch N also moves in a V-shape, as a result the phenomenon occurs that an area UE which is located within the wafer W and which need not be exposed is also exposed (FIG. 10B). Therefore in the vicinity of the above described area UE, there cannot be an area in which a semiconductor component (a circuit pattern or the like) is formed, thereby disadvantageously resulting in a barrier to increasing productivity for semiconductor elements.

SUMMARY OF THE INVENTION

It is therefore one object of the present invention to overcome the deficiencies of the prior art and to provide a device for exposing the peripheral area of a wafer in which an irradiation area is prevented from moving in a V-shape in a notch area of the wafer and the area which is located within the wafer and which need not be exposed is prevented from being exposed.

The above object, and other objects, are achieved by providing a device for exposing a peripheral area of a wafer to which a photoresist has been applied and having a peripheral area provided with a notch, in which by rotation of the wafer, and by simultaneous irradiation of the photoresist in the peripheral area of this wafer with exposure light, this photoresist is exposed. The device further comprises a means for edge determination which consists of a projection part for projecting sensor light and of a light receiving part for receiving this sensor light, and a device for moving the means for edge determination which moves the means for edge determination essentially in the direction to the center of the wafer. The device for exposing the peripheral area further comprises a device for moving the irradiation area which moves the above described area which has been irradiated with exposure light. The projection part projects the sensor light onto the peripheral area of the wafer and the sensor light emitted onto the edge area of the wafer is received by the light receiving part. A controller is provided which controls the device for moving the means for edge determination such that the amount of light received by this light receiving part becomes constant, and which controls the device for moving the irradiation area such that the irradiation area is moved in the same direction as the direction of motion of the means for edge determination and by the same amount as the amount of movement thereof. The controller stops operation of the device for moving the area irradiated with exposure light when it receives a signal from the means for edge determination showing the start of the notch, and restarts the operation of the device for moving the area irradiated with exposure light after a given time has passed, or when it receives a signal from the means for edge determination showing the end of the notch.

The above objects, and other objects, are also achieved by the providing a device for exposing a peripheral area, in which by rotation of the wafer with an outside peripheral area which is provided with a notch and to which a photoresist has been applied, and by simultaneous irradiation of the photoresist in the peripheral area of this wafer with exposure light, this photoresist is exposed. The device comprising a means for edge determination which consists of a projection part for projecting sensor light and of a light receiving part for receiving this sensor light, and a device for moving the means for edge determination which moves the means for edge determination essentially in the direction to the center of the wafer. The device for exposing the peripheral area also includes a device for moving the irradiation area which moves the area which has been irradiated with exposure light. The projection part projects the sensor light onto the peripheral area of the wafer and the sensor light emitted onto the edge area of the wafer is received by the light receiving part. A controller is provided to control the device for moving the means for edge determination such that the amount of light received by this light receiving part becomes constant. The controller also controls the device for moving the irradiation area such that the irradiation area is moved in the same direction as the direction of motion of the means for edge determination and by the same amount as the amount of movement thereof. A notch determination means for determining the notch is located integrally with the means for edge determination upwards of the means for edge determination. The controller stops operation of the device for moving the area irradiated with exposure light after the time following reception of a notch start signal by the notch determination means until the time at which the irradiation area reaches the notch start has passed, and restarts the operation of the device for moving the area irradiated with exposure light after a given time has passed.

In the device of the present invention for exposure of a peripheral area, the controller stops operation of the device for moving the area irradiated with exposure light when it receives a signal from the means for edge determination showing the start of the notch, and restarts the operation of the device for moving the area irradiated with exposure light after a given time has passed, or when it receives a signal from the means for edge determination showing the end of the notch. This prevents the irradiation area from moving in a V shape in the notch area of the wafer.

In the device of the present invention for exposure of a peripheral area, the controller stops operation of the device for moving the area irradiated with exposure light after a given time has passed since reception of a signal from the notch determination means showing the start of the notch, and restarts the operation of the device for moving the area irradiated with exposure light after a given time has passed. This prevents the irradiation area from moving in a V shape in the notch area of the wafer.

DETAILED DESCRIPTION OF THE INVENTION

Referring to FIGS. 1 and 2A–D, the device for exposing a peripheral area of a wafer according to the first embodiment of the present invention has essentially the same general arrangement as the arrangement shown in FIG. 8. Therefore, as in the conventional device for exposing a peripheral area shown in FIG. 8, the exposure light irradiation part 2 is located integrally with the means 4 for edge determination. The motion of the area S irradiated with the exposure light emitted from the exposure light irradiation part 2 is therefore accomplished by the device 3 for moving the means 4 for edge determination. The device 3 for moving the means 4 for edge determination therefore also functions as a device for moving the irradiation area. On the other hand, the device for exposing the peripheral area according to the first embodiment of the invention has several important differences compared to the device shown in FIG. 8 with respect to the arrangement of the controller.

Figure 1:
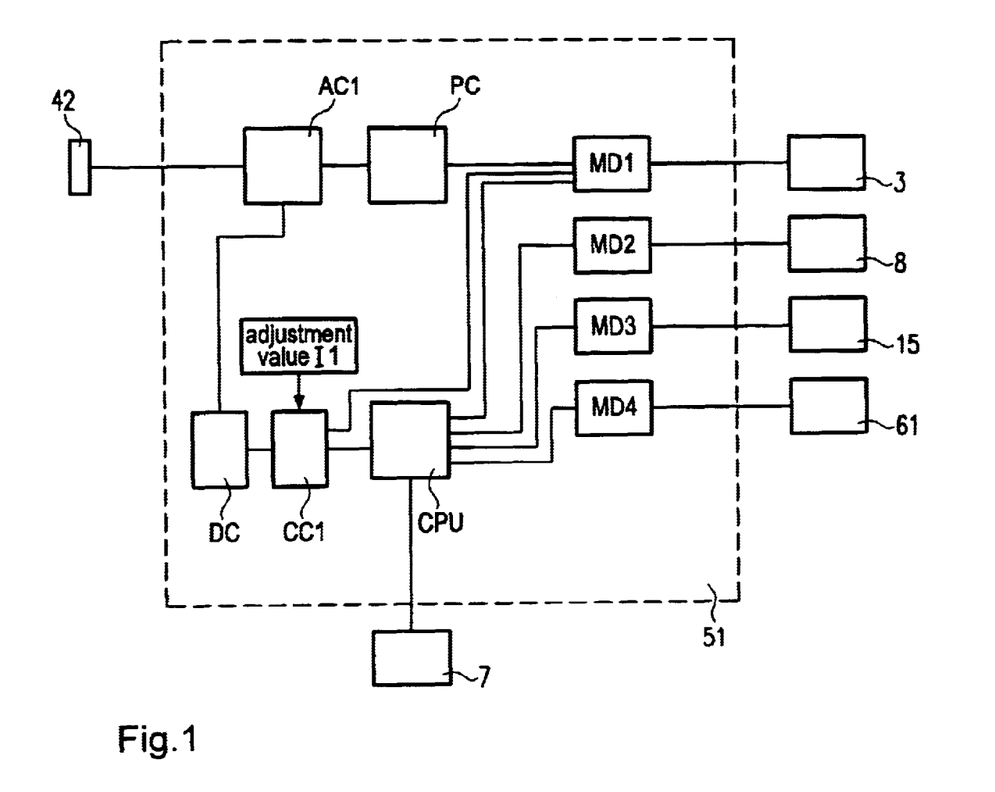
FIG. 1 shows a schematic of the arrangement of a controller of a first embodiment of the device of the present invention for exposing a peripheral area.

FIG. 1 schematically shows the arrangement of the controller of the first embodiment of the device of the present invention for exposing the peripheral area. In the device for exposing the peripheral area according to the first embodiment of the invention, the controller 51 includes a differential circuit DC and a comparison circuit CC1. The comparison circuit CC1 compares an arrived signal value to the preset adjustment value and outputs an ON signal to the operating part of the CPU and the part MD1 for driving the device for moving the means for edge determination in order to show that the notch N has been determined when the input signal value is greater than the adjustment value and outputs to them an OFF signal when the input signal value is less than the adjustment value.

As in the conventional example, an analog signal from the light receiving part 42 of the means 4 for edge determination is amplified by the amplifier AC1 within the controller 51. The part MD1 for driving the device for moving the means for edge determination within the controller 51 controls the device 3 for moving the means for edge determination such that the means 4 for edge determination is positioned at a site at which the amplified voltage signal is 0 V, i.e. at the location of the edge E of the wafer W. The signal amplified by the above described amplifier AC1 is furthermore input into the differential circuit DC which differentiates this signal and outputs the differential data to the comparison circuit CC1.

The comparison circuit CC1 compares the input differential data to a preset adjustment value 11 and outputs an ON signal to the part MD1 to drive the device for moving the means for edge determination and the operating part of the CPU when the input differential data is greater than the adjustment value 11.

When the ON signal is input, the part MD1 for driving the device for moving the means for edge determination stops operation of the device 3 for moving the means for edge determination.

On the other hand, when the ON signal is input, the operating part of the CPU executes the calculation described below and outputs to the part MD1 an operation restart signal after a given time has passed. The part MD1 for driving the device for moving the means for edge determination restarts operation of the device 3 when the operation restart signal is input.

In the first embodiment of the invention, the state is described below using FIGS. 2A–D in which the peripheral area of a wafer, having an outside peripheral area which is provided with a notch N and to which a photoresist has been applied, is exposed by the edge of this wafer being determined. An enlarged representation of the notch area of the wafer is shown in each of FIGS. 2A–D. The wafer W which has been placed on the treatment stage 6 is turned clockwise by the drive of the treatment stage drive device 61. The means 4 for edge determination determines the edge E of the wafer W at position o. The area S irradiated with the exposure light which emerges from the exposure light exit part 2 is located on the surface of the wafer W at the point at which the sensor light from the projection part 41 is emitted onto the peripheral area of the wafer W, i.e. essentially at the same location as position o.

Figure 2A:
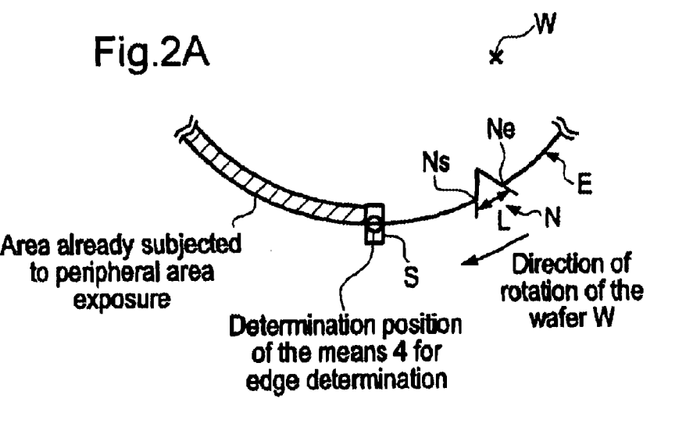
FIGS. 2A–D each show a schematic of the state in which the peripheral area of a wafer is exposed.

The operation is as follows for the case in which the edge area of the wafer, except for the notch, is determined by the means for edge determination (FIG. 2A). The controller 51 controls the device 3 for moving the means for edge determination and moves the means 4 for edge determination to a position at which the means 4 for edge determination outputs to the controller 51 a signal which shows that the edge E of the wafer W is always captured, i.e. to a position at which the means 4 for edge determination outputs to the controller 51 a constant analog signal. The amount of sensor light from the projection part 41 which is projected onto the light receiving part 42 therefore hardly changes. Even if the middle O of the wafer W and the center of rotation of the treatment stage 6 do not agree with one another and the wafer W turns eccentrically, an acute change does not appear in the signal from the light receiving part 42 because the edge E is a smooth arc. The differential data output from the differential circuit DC of the controller 51 of the comparison circuit CC1 is therefore smaller than the adjustment value 11. The device 3 for moving the means for edge determination therefore exposes the peripheral area by its moving the area S irradiated with exposure light which is emitted from the exposure light exit part 2. Here the adjustment value 11 was intended to reduce the "noise" of the differential data. The adjustment value 11 may be, for example, a threshold value which has been set to prevent the controller 51 from incorrectly recognizing scratches or the like of the edge E of the wafer as notches N.

Figure 2B:
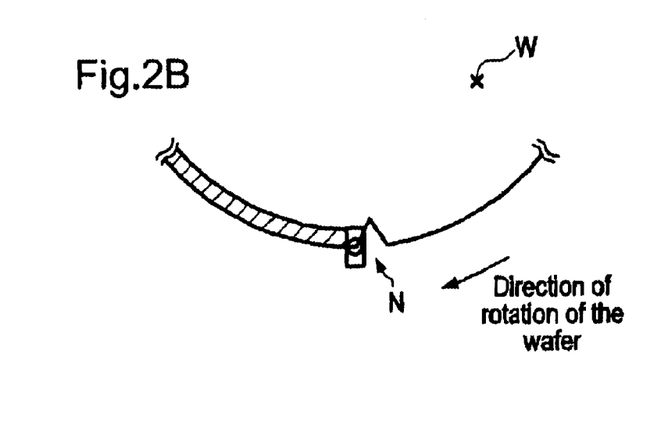

The operation is as follows for the case in which the means for edge determination has reached the start of the notch of the wafer (FIG. 2B). When the wafer W is turning clockwise and reaches the start Ns of the notch N of the wafer W for the determination position o of the means 4 for edge determination, the amount of sensor light from the projection part 41 which is projected onto the light receiving part 42 increases acutely because, in the area of the notch N, the wafer W which has shielded the sensor light has been removed and is no longer present. As a result, the differential data which has been output by the differential circuit DC of the controller 51 of the comparison circuit CC1 becomes greater than the adjustment value 11. Therefore an ON signal is output from the comparison circuit CC1 to the part MD1 and to the operating part of the CPU. The part MD1 stops operation of the device 3 for moving the means for edge determination and the operating part of the CPU computes the time at which the operation of the device 3 is restarted.

There are various computation methods. For example, based on the gap dimension L of the notch N which is determined by the SEMI standard, and based on the rotational speeds of the treatment stage 6 which were input into the input part 7, the time T, during which the means 4 for edge determination travels from the start Ns of the notch N to the end Ne of the notch N, is determined.

Figure 2C:
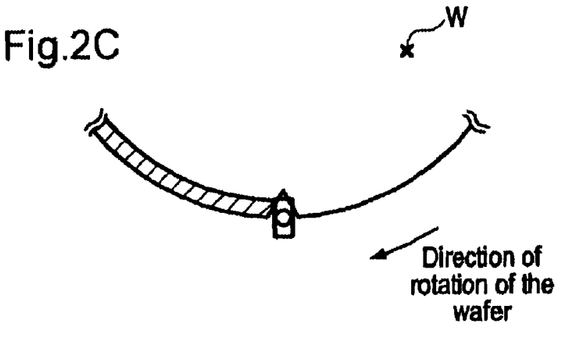
Figure 2D:
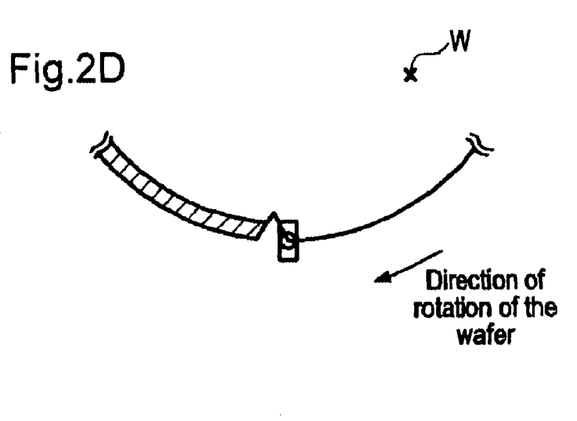

The operation is as follows for the case in which the means for edge determination is located within the notch area (in the gap area of the wafer (FIG. 2C). The exposure light emerges in the state in which the device 3 stops operation. The wafer W which has been placed on the treatment stage 6 continues rotation with a set speed of rotation.

The operation is as follows for the case in which the time T, after the means for edge determination had reached the start Ns of the notch (FIG. 2D), has passed. The time T at which operation of the device 3 for moving the means for edge determination is restarted, runs out. A signal to restart the operation of the device 3 is output from the operating part of the CPU within the controller 51 to the part MD1 for driving the device for moving the means for edge determination. Operation of the device 3 is restarted and the device 3 exposes the peripheral area by moving the area S irradiated with the exposure light which is emitted from the exposure light exit part 2.

The advantage of the present embodiment of the invention is described below. The controller stops the operation of the device for moving the area irradiated with exposure light when it receives from the means for edge determination the signal which shows the start of the notch, i.e. when the area S irradiated with the exposure light reaches the start Ns of the notch N, and restarts operation of the device for moving the area irradiated with the exposure light after a given time has passed, i.e. when the area S irradiated with the exposure light reaches the end Ne of the notch N. Therefore the irradiation area is prevented from moving in a V-shape in the notch area of the wafer and the area which is located within the wafer and which need not be exposed is prevented from being exposed.

In this embodiment, the operation of the device 3 for moving the area irradiated with the exposure light is stopped by the controller 51 when it receives from the means 4 the signal which shows the start Ns of the notch N, and restarts after a given time has passed. But the invention is not limited thereto. Operation of the device 3 for moving the area irradiated with the exposure light can be restarted when it receives from the means 4 for edge determination the signal which shows the end Ne of the notch N (the signal for showing the end Ne of the notch N in contrast to the signal which shows the start Ns of the notch N is output when the end Ne of the notch N of the wafer W has reached the determination position o of the means 4 when the edge E of the wafer W has appeared which shields the sensor light and when the amount of sensor light from the projection part 41 which is projected onto the light receiving part 42 has decreased acutely).

A second embodiment of the device of the present invention for exposing a peripheral area is described below. The device for exposing a peripheral area according to the second embodiment of the invention has essentially the same general arrangement as the arrangement shown in FIG. 8 but also includes important differences. One difference in particular is that a determination means for determining the notch is also provided. Here, as in the conventional device for exposing a peripheral area shown in FIG. 8, the exposure light irradiation part 2 is located integrally with the means 4 for edge determination. Motion of the area S irradiated with the exposure light emitted from the exposure light irradiation part 2 is therefore accomplished by the device 3 for moving the means 4 for edge determination. The device 3 for moving the means 4 for edge determination therefore also functions as a device for moving the irradiation area.

Figure 3:
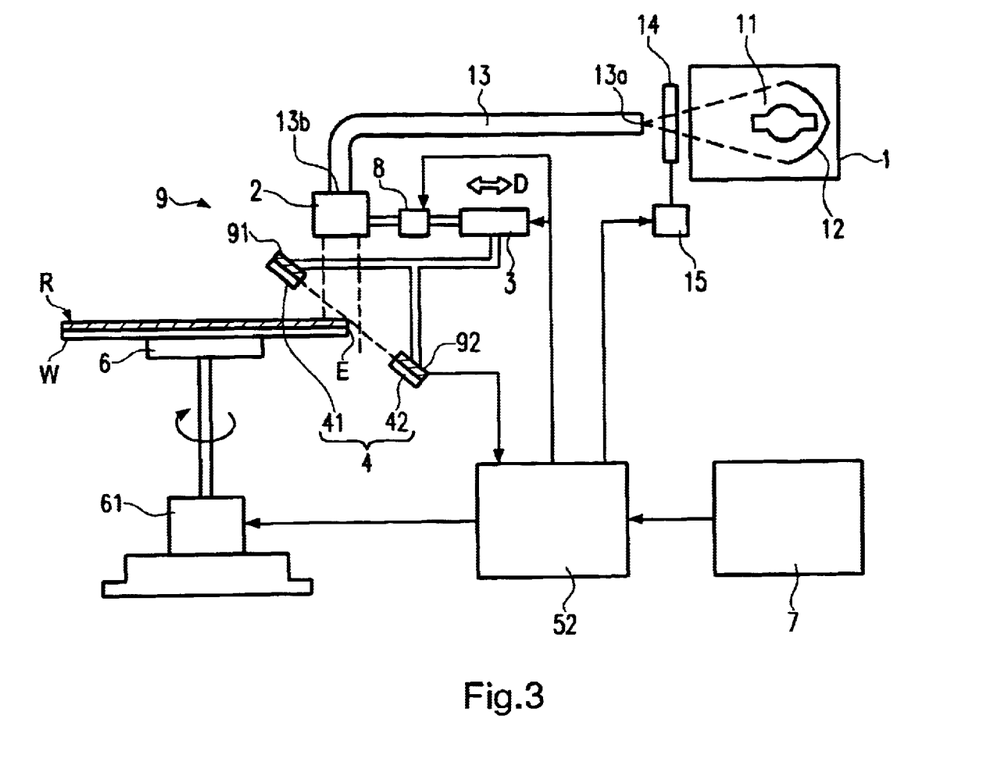
FIG. 3 shows a schematic of the arrangement of a second embodiment of a device of the present invention for exposure of a peripheral area.
Figure 4:
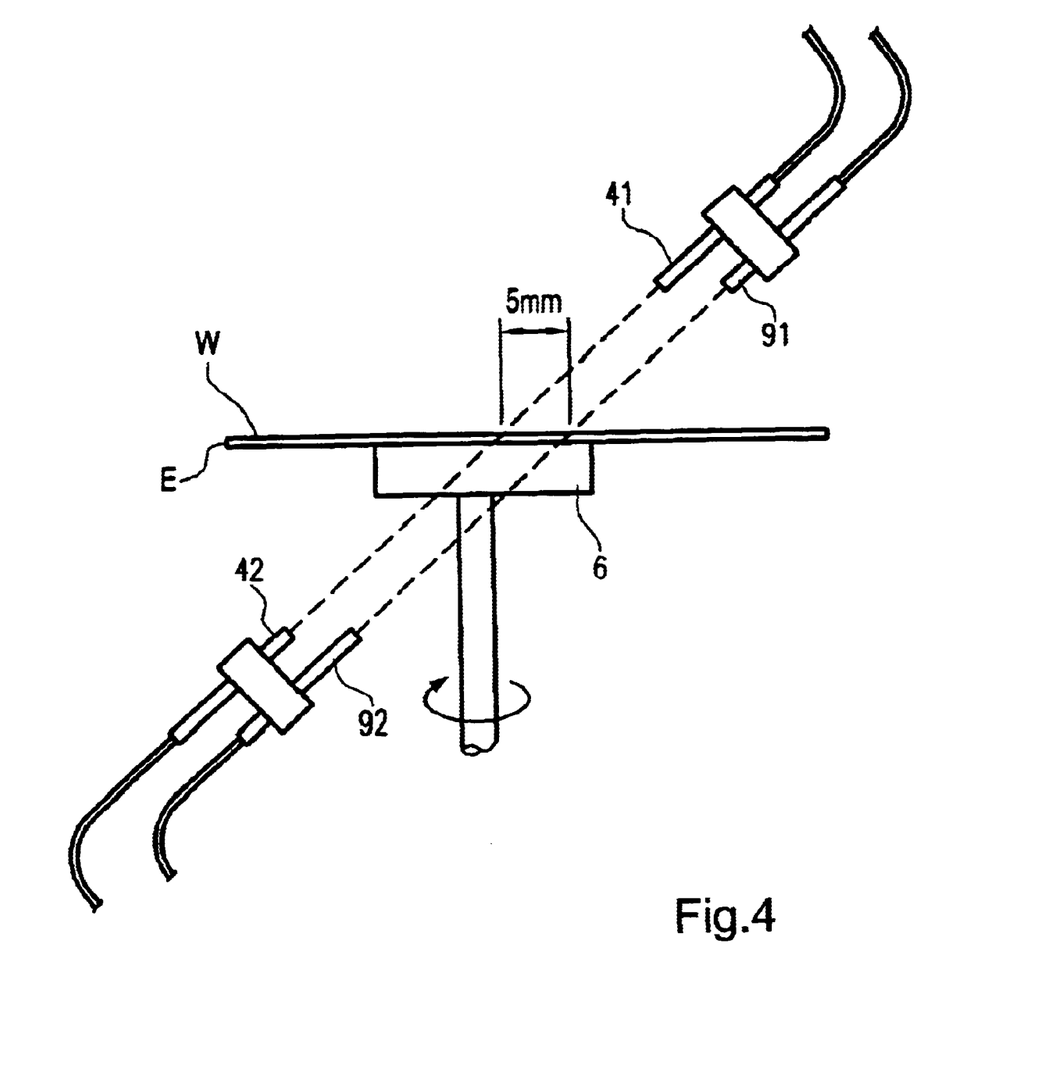
FIG. 4 shows a schematic of the arrangement of a notch determination means of the device for exposing a peripheral area according to the second embodiment of the present invention.
Figure 5:
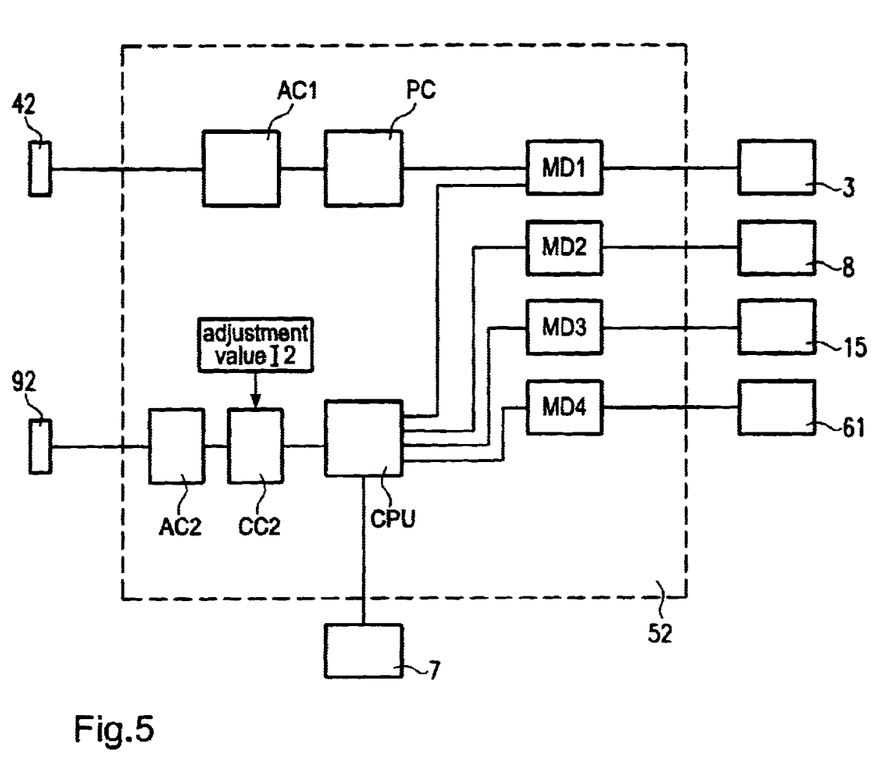
FIG. 5 shows a schematic of the arrangement of a controller of the device for exposing a peripheral area according to the second embodiment of the invention.

FIG. 3 schematically shows the arrangement of a second embodiment of the device as claimed in the invention for exposing the peripheral area. FIG. 4 schematically shows the arrangement of the notch determination means of the device for exposing the peripheral area according to the second embodiment of the invention. FIG. 5 schematically shows the arrangement of a controller of the device for exposing the peripheral area according to the second embodiment of the invention. In the device for exposing the peripheral area according to the second embodiment of the invention, besides the means 4 for edge determination which determines the edge E of the wafer W, there is a notch determination means 9 which only determines the notch N.

The notch determination means 9 consists, like the means 4 for edge determination, of a projection part 91 which projects sensor light, and of the light receiving part 92 which receives this sensor light, and is at the location at which, when the wafer W turns, the notch N of the wafer W can be determined earlier than by the means 4 for edge determination, for example 5 mm upwards of the means 4 for edge determination as is shown in FIG. 4. The terms "upwards" is defined as the peripheral area of the wafer which is caused to approach the means for edge determination, and the term "downwards" is defined as the peripheral area of the wafer which is remote from the means for edge determination. Since the notch determination means 9 is arranged integrally with the means 4 for edge determination, the sensor light can be projected into the vicinity of the wafer edge.

In the device for exposing a peripheral area according to the second embodiment of the invention, in the controller 52, an amplifier AC2 and a comparison circuit CC2 are provided to process signals from the light receiving part 92 of the above described notch determination means 9. The comparison circuit CC2 compares an arrived signal value to the preset adjustment value and outputs an ON signal to the operating part of the CPU in order to show that the notch N has been determined when the input signal value is greater than the adjustment value and outputs an OFF signal to it when the input signal value is less than the adjustment value.

As in the analog signal from the light receiving part 42 of the means 4 for edge determination, the analog signal from the light receiving part 92 of the notch determination means 9 is amplified by the amplifier AC2 within the controller 52 and is input to the comparison circuit CC2. The comparison circuit CC2 compares the above described input signal value to a preset adjustment value 12 and outputs an ON signal to the operating part of the CPU when the input signal value is greater than the adjustment value 12. When the ON signal is input, the operating part of the CPU performs the computation described below, outputs an operation stop signal after a given time to the part MD1 for driving the device for moving the means for edge determination, stops operation of the device 3 for moving the means for edge determination, outputs an operation restart signal after a given time has passed and restarts operation of the device 3 for moving the means for edge determination.

Below, in the second embodiment of the invention, the operation is described using FIGS. 6A–D in which the peripheral area of a wafer, having an outside peripheral area which is provided with a notch and to which a photoresist has been applied, is exposed by the edge of this wafer being determined. An enlarged representation of the notch area of the wafer is shown in each of FIGS. 6A–D. The wafer W which has been placed on the treatment stage 6 is turned clockwise by the drive of the treatment stage drive device 61. The means 4 for edge determination determines the edge E of the wafer W at position o. The area S irradiated with the exposure light which emerges from the exposure light exit part 2 is located on the surface of the wafer W at the point at which the sensor light from the projection part 41 is emitted onto the peripheral area of the wafer W, i.e. essentially at the same location as the position o. The notch determination means 9 determines the edge E of the wafer W upwards of the wafer W, i.e. at position ●.

Figure 6A:
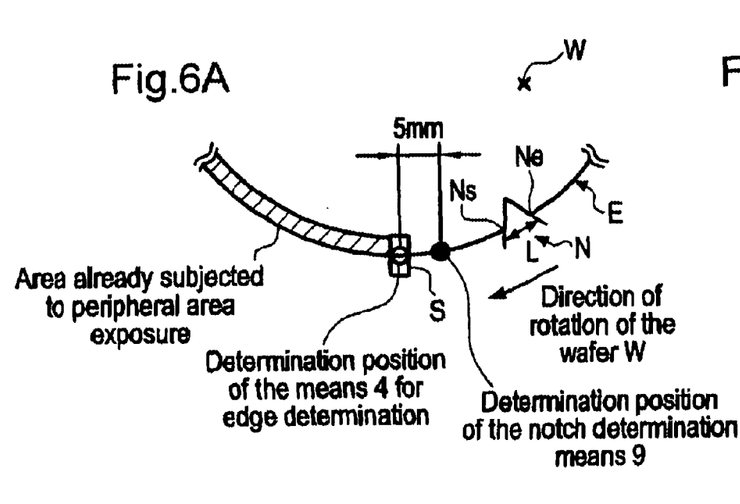
FIGS. 6A–D each show a schematic of the state in which the peripheral area of a wafer is exposed.

The operation is as follows for the case in which the edge area of the wafer, except for the notch, is determined by the means for edge determination (FIG. 6A). The controller 52 controls the device 3 for moving the means 4 for edge determination and moves the means 4 to a position at which the means 4 outputs to the controller 52 a signal which shows that the edge E of the wafer W is always captured, i.e. to a position at which the means 4 outputs a constant analog signal to the controller 52. The amount of sensor light from the projection part 41 which is projected onto the light receiving part 42 therefore hardly changes. Even if the middle O of the wafer W and the center of rotation of the treatment stage 6 do not agree with one another and the wafer W turns eccentrically, a major change does not appear in the signal from the light receiving part 42 because the edge E is a smooth arc. Since the notch determination means 9 in the vicinity of the means 4, which determines the edge E of the wafer W, is located integrally with the means 4, the amount of sensor light which is input into the light receiving part 92 of the notch determination means 9 is essentially the same as the amount of light received by the light receiving part 42 of the means 4 even if the wafer W is turning eccentrically. Therefore the same analog signal as for the light receiving part 42 is output to the comparison circuit CC2 of the controller 52. The value of the above described signal which is input to the comparison circuit CC2 is therefore smaller than the adjustment value 12. The device 3 for moving the means for edge determination therefore exposes the peripheral area by moving the area S irradiated with exposure light which is emitted from the exposure light exit part 2. Here the adjustment value 12 was intended to reduce the "noise" of the analog signal and may be, for example, a threshold value which has been set to prevent the controller 52 from incorrectly recognizing scratches or the like of the edge E of the wafer as notches N.

Figure 6B:
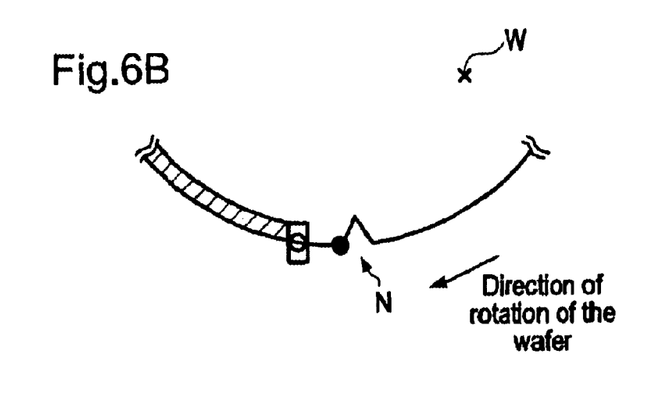

The operation is as follows for the case in which the notch determination means has reached the start of the notch of the wafer (FIG. 6B). When the wafer W is turning clockwise and reaches the start Ns of the notch N of the wafer W for the determination position ● of the notch determination means 9, the amount of sensor light from the projection part 91 which is projected onto the light receiving part 92 increases acutely because, in the area of the notch N, the wafer W which has shielded the sensor light has been removed and is no longer present. As a result, the analog signal which is output to the comparison circuit CC2 of the controller 52 is greater than the adjustment value 12, and an ON signal is output to the operating part of the CPU from the comparison circuit CC2. Based on the ON signal, from the rotational speed of the treatment stage 6 and from the distance between the determination position ● of the notch determination means 9 and the determination position o of the means 4 for edge determination (in this embodiment 5 mm), the operating part of the CPU computes the time T1 up to the time at which the area S irradiated with the exposure light reaches the start Ns of the notch N.

Figure 6C:
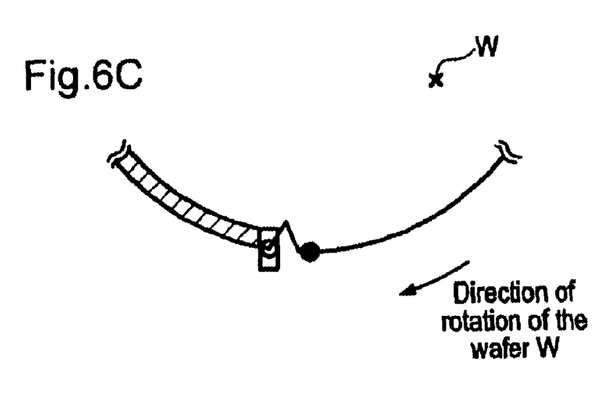

The operation is as follows for the case in which time T has passed after the notch determination means has reached the start of the notch (FIG. 6C). When time T runs out, after the notch determination means 9 has reached the start Ns of the notch N, the area S irradiated with the exposure light reaches the start Ns of the notch N. The operating part of the CPU outputs an operation stop signal to the part MD1 for driving the device for moving the means for edge determination. The part MD1 stops operation of the device 3 for moving the means for edge determination based on this signal. The operating part of the CPU computes the time T2 at which operation of the device 3 for moving the means for edge determination after stopping is restarted.

There are various computation methods. For example, based on the gap dimension L of the notch N which is determined by the SEMI standard, and based on the rotational speeds of the treatment stage 6 which have been input into the input part 7, the time T2 is determined during which the area S irradiated with the irradiation light travels from the start Ns of the notch N to the end Ne of the notch N.

Figure 6D:
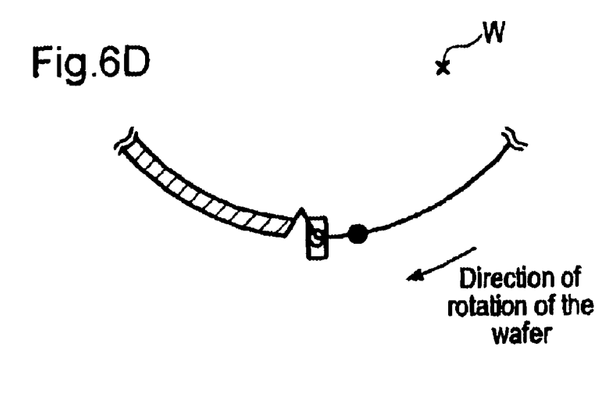

The operation is as follows for the case in which the time T2, after the area irradiated with the irradiation light has reached the start of the notch, has expired (FIG. 6D). When time T2 runs out after the area S irradiated with exposure light reaches the start Ns of the notch N, the area S irradiated with exposure light reaches the end Ne of the notch N. The operating part of the CPU within the controller 52 outputs a signal to the part MD1 with which operation of the device 3 for moving the means for edge determination is to be restarted. Operation of the device 3 is thus restarted. The device 3 for moving the means for edge determination exposes the peripheral area by moving the area S irradiated with exposure light which is emitted from the exposure light exit part 2.

The advantages of the present embodiment of the invention are described below. In the device of the present invention for exposing a peripheral area, the controller stops operation of the device for moving the area irradiated with exposure light after a given time has passed after it receives from the notch determination means the signal which shows the start of the notch, i.e. when the area S irradiated with the exposure light reaches the start Ns of the notch N, and furthermore restarts operation of the device for moving the area irradiated with the exposure light after a given time has passed, i.e. when the area S irradiated with the exposure light reaches the end Ne of the notch N. Therefore, the irradiation area is prevented from moving in a V-shape in the notch area of the wafer and the area which is located within the wafer and which need not be exposed is also prevented from being exposed.

In this embodiment, an analog signal from the light receiving part 92 of the notch determination means 9 was amplified by the amplifier AC2 within the controller 52 and was compared to the preset adjustment value 12 in the comparison circuit CC2. When it is greater than the adjustment value 12, the ON signal is output to the operating part of the CPU. The invention is not limited thereto, but, as in the first embodiment, between the amplifier circuit AC2 and the comparison circuit CC2, there can be a differential circuit. The differential data can be compared to the preset adjustment value in the comparison circuit CC2 and an ON signal can be output to the operating part of the CPU when it is greater than the adjustment value.

Figure 7A:
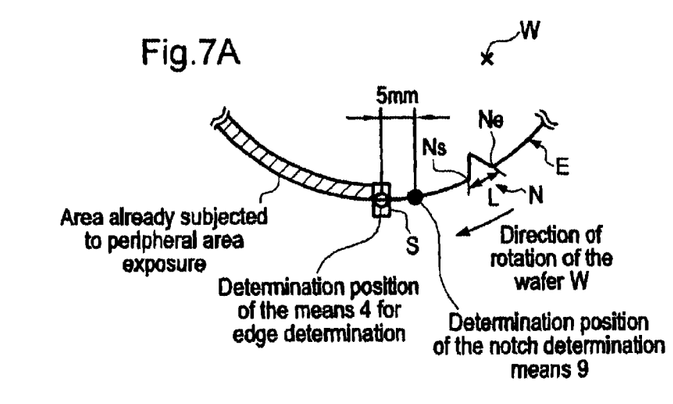
FIGS. 7A–E each show a schematic of the state in which the peripheral area of a wafer is exposed.

In this embodiment, the time T2 at which operation of the device 3 is restarted after stopping, based on the gap dimension L of the notch N which is determined by the SEMI standard, and based on the rotational speeds of the treatment stage 6 which were input into the input part 7, was determined. The invention is not limited thereto however and thus, for example, the following process can be carried out. In the case in which the edge area of the wafer, except for the notch, is determined by the notch determination means (FIG. 7A), the controller 52 controls the device 3 and moves the means 4 for edge determination to a position at which the means 4 outputs to the controller 52 a signal which shows that the edge E of the wafer W is always captured, i.e. to a position at which the means 4 outputs to the controller 52 a constant analog signal. The amount of sensor light from the projection part 41 which is projected onto the light receiving part 42 therefore hardly changes. Even if the middle O of the wafer W and the center of rotation of the treatment stage 6 do not agree with one another and the wafer W turns eccentrically, a major change does not appear in the signal from the light receiving part 42 because the edge E is a smooth arc. Since the notch determination means 9 in the vicinity of the means 4, which determines the edge E of the wafer W, is located integrally with the means 4 for edge determination, the amount of sensor light which is input into the light receiving part 92 of the notch determination means 9 is essentially the same value as the amount of light received by the light receiving part 42 of the means 4 even if the wafer W is turning eccentrically. Therefore the same analog signal as for the light receiving part 42 is output to the comparison circuit CC2 of the controller 52. The value of the signal which is input to the comparison circuit CC2 is therefore smaller than the adjustment value 12. An OFF signal is input to the operating part of the CPU. Based on the OFF signal, the operating part of the CPU outputs a signal to the part MD1 such that the operation of the device 3 for moving the means for edge determination is continued. The device 3 for moving the means for edge determination exposes the peripheral area by its moving the area S irradiated with exposure light which is emitted from the exposure light exit part 2.

Figure 7B:
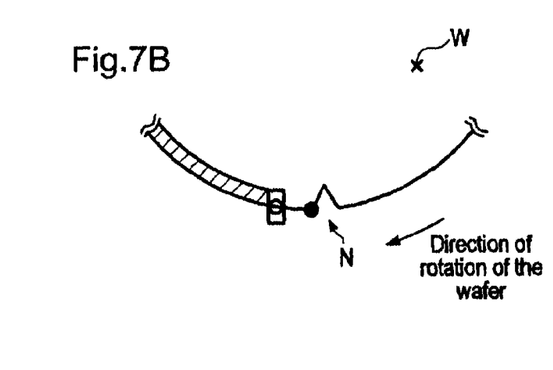

The operation is as follows for the case in which the notch determination means has reached the start of the notch of the wafer (FIG. 7B). When the wafer W is turning clockwise and reaches the start Ns of the notch N of the wafer W for the determination position ● of the notch determination means 9, the amount of sensor light from the projection part 91 which is projected onto the light receiving part 92 increases acutely because, in the area of the notch N, the wafer W, which has shielded the sensor light, has been removed and is no longer present. As a result, the analog signal which is output to the comparison circuit CC2 of the controller 52 is greater than the adjustment value 12, and an ON signal is output to the operating part of the CPU from the comparison circuit CC2. Based on the above described ON signal, from the rotational speed of the treatment stage 6 and from the distance between the determination position ● of the notch determination means 9 and the determination position o of the means 4 for edge determination (in this embodiment 5 mm), the operating part of the CPU computes the time T1 up to the time at which the area S, irradiated with the exposure light, reaches the start Ns of the notch N.

Figure 7C:
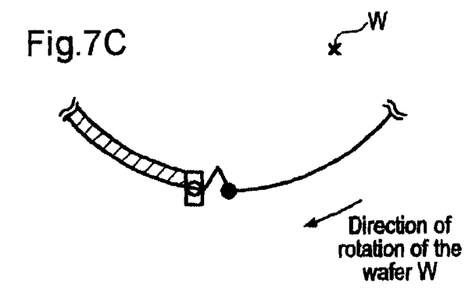

In the case in which the notch determination means has reached the end Ne of the notch N (FIG. 7C), the amount of sensor light which is projected onto the light receiving part 92 of the edge determination means 9 decreases and approaches the value of the analog signal before determining the notch N. The value of the above described signal which is input to the comparison circuit CC2 is therefore smaller than the adjustment value 12. The comparison circuit CC2 outputs an OFF signal to the operating part of the CPU, and the operating part of the CPU, based on the time after output of the ON signal up to repeated output of the OFF signal, computes the time T2 during which the area S irradiated with the irradiation light travels from the start Ns of the notch N to the end Ne of the notch N.

Figure 7D:
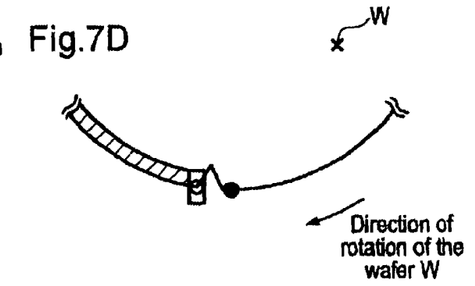

In the case in which time T1 has passed or run out after the notch determination means 9 has reached the start Ns of the notch N (FIG. 7D), the area S irradiated with the exposure light reaches the start Ns of the notch N. The operating part of the CPU outputs an operation stop signal to the part MD1 for driving the device for moving the means for edge determination. The part MD1 stops operation of the device 3 for moving the means for edge determination based on this signal.

Figure 7E:
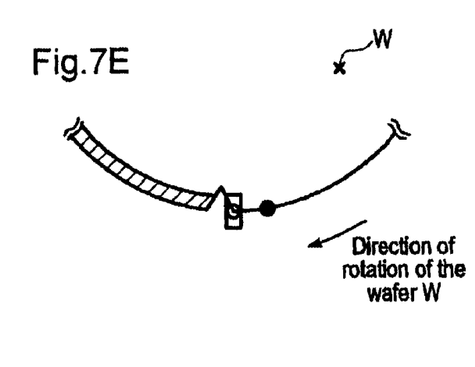

In the case in which time T2 has passed or runs out after the area S irradiated with the irradiation light has reached the start Ns of the notch N (FIG. 7E), the area S irradiated with exposure light reaches the end Ne of the notch N. The operating part of the CPU within the controller 52 outputs a signal to the part MD1 with which operation of the device 3 for moving the means for edge determination is to be restarted. Operation of the device 3 for moving the means for edge determination is thus restarted. The device 3 exposes the peripheral area by its moving the area S irradiated with exposure light which is emitted from the exposure light exit part 2.

In the above described first and second embodiments of the device for exposing a peripheral area of a wafer, the, exposure light irradiation part and the wafer edge determination means are located integrally with one another. The area irradiated with exposure light which is emitted from the exposure light irradiation part is moved by the device for moving the means for edge determination. However, the invention is not limited thereto, but the device for moving the irradiation area which moves the area which has been irradiated with exposure light emitted from the exposure light irradiation part and the device for moving the means for edge determination which moves the means for edge determination, can be arranged individually and this irradiation area can be moved in the same direction as the direction of motion of the means for edge determination and by the same amount as the amount of movement thereof.

As was described above, the present invention includes a controller which stops operation of the above described device for moving the area irradiated with exposure light when it receives a signal from the above described means for edge determination showing or indicating the start of the notch. The controller then restarts the operation of the above described device for moving the area irradiated with exposure light after a given time has passed, or when it receives a signal from the above described means for edge determination, which signal shows or indicates the end of the notch. This therefore prevents the irradiation area from moving in a V shape in the notch area of the wafer. Also, the area located within the wafer and which need not be exposed, is prevented from being exposed.

The device of the present invention may include a controller which stops operation of the device for moving the area irradiated with exposure light after a given time has passed after reception of a signal from the notch determination means showing the start of the notch, up to the time at which the irradiation area reaches the start of the notch. The controller also restarts the operation of the device for moving the area irradiated with exposure light after a given time has passed. This prevents the irradiation area from moving in a V shape in the notch area of the wafer. Also, the area which is located within the wafer and which need not be exposed, is prevented from being exposed.

Therefore, the peripheral area of the wafer can be irradiated with a given exposure width even if the wafer is provided with a notch.

We claim:

1. A device for exposing a peripheral area of a wafer having an outside peripheral area with a photoresist applied thereon and provided with a notch, whereby the photoresist is exposed by rotation of the wafer and by simultaneous irradiation of the photoresist in the peripheral area of the wafer with exposure light to form an irradiation area, the device comprising:

means for edge determination including a projection part for projecting sensor light and a light receiving part for receiving the sensor light, said projection part projecting the sensor light onto the peripheral area of the wafer and the light receiving part receiving the sensor light emitted onto the edge area of the wafer;

a moving device adapted to move the edge determination means in a direction toward a center of the wafer;

an irradiation area moving device adapted to move the irradiation area; and a controller adapted to control the moving device to cause the amount of light received by this light receiving part to become constant, the controller further adapted to control the irradiation area moving device to move the irradiation area in the same direction as the direction of motion of the edge determination means and by a same amount as an amount of movement of the edge determination means, said controller further adapted to stop operation of the irradiation area moving device upon receiving a signal from the edge determination means indicating a start of the notch, and to restart operation of the irradiation moving device upon one of a) the passing of a given time period, or b) upon the controller receiving a signal from the edge determination means indicating an end of the notch.

2. A device for exposing a peripheral area of a wafer having an outside peripheral area with a photoresist applied thereon and provided with a notch, whereby the photoresist is exposed by rotation of the wafer and by simultaneous irradiation of the photoresist in the peripheral area of the wafer with exposure light to form an irradiation area, the device comprising:

means for edge determination including a projection part for projecting sensor light and a light receiving part for receiving the sensor light, said projection part projecting the sensor light onto the peripheral area of the wafer and the light receiving part receiving the sensor light emitted onto the edge area of the wafer;

a moving device adapted to move the edge determination means in a direction toward a center of the wafer;

an irradiation area moving device adapted to move the irradiation area;

a notch determination means for determining the notch, said notch determination means being located integrally with the edge determination means upwards of the edge determination means; and a controller adapted to control the moving device to cause the amount of light received by this light receiving part to become constant, the controller further adapted to control the irradiation area moving device to move the irradiation area in the same direction as the direction of motion of the edge determination means and by a same amount as an amount of movement of the edge determination means, wherein the controller stops operation of the irradiation area moving device after a time period following reception by the controller of a notch start signal from the notch determination means, and restarts operation of the irradiation area moving device after a given time has passed.

* * * * *